(12) United States Patent
Cunningham et al.

(10) Patent No.: US 11,462,293 B2
(45) Date of Patent: Oct. 4, 2022

(54) SYSTEM AND METHOD FOR ERROR CORRECTION

(71) Applicant: Graphcore Limited, Bristol (GB)

(72) Inventors: Graham Bernard Cunningham, Chippenham (GB); Stephen Felix, Bristol (GB)

(73) Assignee: GRAPHCORE LIMITED, Bristol (GB)

(*) Notice: Subject to any disclaimer, the term of this patent is extended or adjusted under 35 U.S.C. 154(b) by 0 days.

(21) Appl. No.: 17/443,061

(22) Filed: Jul. 20, 2021

(65) Prior Publication Data

US 2022/0157398 A1 May 19, 2022

(30) Foreign Application Priority Data

Nov. 17, 2020 (GB) ........................... 2018025

(51) Int. Cl.
| | | |
|---|---|---|
| H03M 13/00 | (2006.01) | |
| G11C 29/42 | (2006.01) | |
| H03M 13/11 | (2006.01) | |
| H03M 13/15 | (2006.01) | |
| G11C 29/12 | (2006.01) | |

(52) U.S. Cl.
CPC ........ *G11C 29/42* (2013.01); *G11C 29/12015* (2013.01); *H03M 13/1111* (2013.01); *H03M 13/154* (2013.01)

(58) Field of Classification Search
CPC ... G11C 2029/1204; G11C 2029/1208; H03M 13/1111; H03M 13/154; H03M 13/293; H03M 13/373
See application file for complete search history.

(56) References Cited

U.S. PATENT DOCUMENTS

| | | | | |
|---|---|---|---|---|
| 7,752,531 B2* | 7/2010 | Patapoutian | ........ | H03M 13/373 714/795 |
| 7,900,125 B1* | 3/2011 | Liu | ...................... | H03M 13/453 714/760 |
| 8,458,536 B2* | 6/2013 | Yang | ................... | H03M 13/373 714/708 |
| 9,032,263 B2* | 5/2015 | Yang | ................... | H03M 13/151 714/719 |
| 9,626,243 B2* | 4/2017 | Nicholson | ........... | G06F 11/1012 |
| 9,710,324 B2* | 7/2017 | Trombley | ........... | G06F 11/1012 |
| 11,063,694 B2* | 7/2021 | Coulombe | ........ | H03M 13/3761 |

* cited by examiner

*Primary Examiner* — Esaw T Abraham
(74) *Attorney, Agent, or Firm* — Haynes and Boone, LLP (57) ABSTRACT

A memory controller is provided for reading and writing to and from a memory module. The memory controller implements an error correction algorithm, which calculates error correction code for message data to be written to the memory module and checks the error correction code against the message data when the data is read out of the memory module. The memory controller spreads each codeword over at least four different beats sent over the interface with the memory module, with each beat comprising a symbol of error correction code. Bits of a particular symbol of message data occupy the same positions in different beats. Since the bits of the symbols occupy the same positions in different beat, the number of bits affected by a hardware error is minimised. With four symbols of error correction code available for use in the codeword.

28 Claims, 9 Drawing Sheets

SYSTEM AND METHOD FOR ERROR CORRECTION

CROSS-REFERENCE TO RELATED APPLICATIONS

The present application claims priority to United Kingdom Patent Application No. 2018025.3, filed on Nov. 17, 2020, the disclosure of which is hereby incorporated herein by reference in its entirety.

TECHNICAL FIELD

The present disclosure relates to a memory controller, and in particular, to a memory controller for reading and writing codewords of data to a memory module.

BACKGROUND

Memory modules are used to store data for later retrieval and use in applications. However, the processes of writing, storing, and retrieving the data from such memory modules can expose the data to sources of error that can cause the values of the data to change.

There are two different types of error that commonly occur in memory, these being random errors and hardware errors. Random errors result from ionising radiation that causes the content of memory cells to change. Such ionising radiation may cause the value of a bit stored in a memory cell to flip from a '1' to a '0' or vis versa. The ionising radiation may be received from sources external to a memory module or may be emitted by the materials used to package electronics. Random errors are rare, but can be problematic, since it is not possible to predict whether a random error will occur in any particular bit of data.

Hardware errors, which are more predictable, could result from numerous different sources. The errors could affect regions of the memory module or individual wires of the memory module. Some examples of sources of hardware errors include: clock signal timing errors, noise on a bus for transporting data, entire regions of the memory module becoming faulty due to aging, dirty connections of the memory module, and dry soldier joints.

Error correction codes (ECC) are used to control errors in data sent over communication channels. An ECC is calculated by performing certain operations on a set of message data. The ECC is then sent along with the message data in a codeword. The ECC represents certain redundant information that allows for the correction of one or more errors that may be present in the message data. Certain ECCs work on blocks, referred to as symbols, which each have a predefined number of bits.

One type of error correction code is SECDED (single-error correcting and double-error detecting), which is an extended hamming code. If a single bit error occurs in a codeword, SECDED codes comprise sufficient information to enable the detection and correction of the single erroneous bit. If a double bit error occurs in a codeword, SECDED codes comprise sufficient information to enable the error correction algorithm to detect that the double bit error has occurred, but insufficient information to correct the double bit error.

It is understood, therefore, that ECCs allow a limited amount of information to be recovered. In other words, there are a limited number of unknowns—e.g. the number of bit errors or the location of bit errors—that it is possible to determine from a particular number of ECC bits. ECCs may operate such that a smaller number of bits of ECC is sufficient to correct an erroneous symbol in the case that the location of the erroneous symbol is known beforehand. In the case that the location in the codeword of the erroneous symbol is known, only one symbol of ECC is required to reproduce the correct symbol. In the case that the location of an erroneous symbol is not known, two symbols of ECC are required to detect and correct the erroneous symbol. It is understood that the more ECC symbols that are included in the codeword, the more errors that can be detected and corrected. An example of such an ECC is the Reed-Solomon code, which typically operates with a symbol size of one byte.

Figure 1:
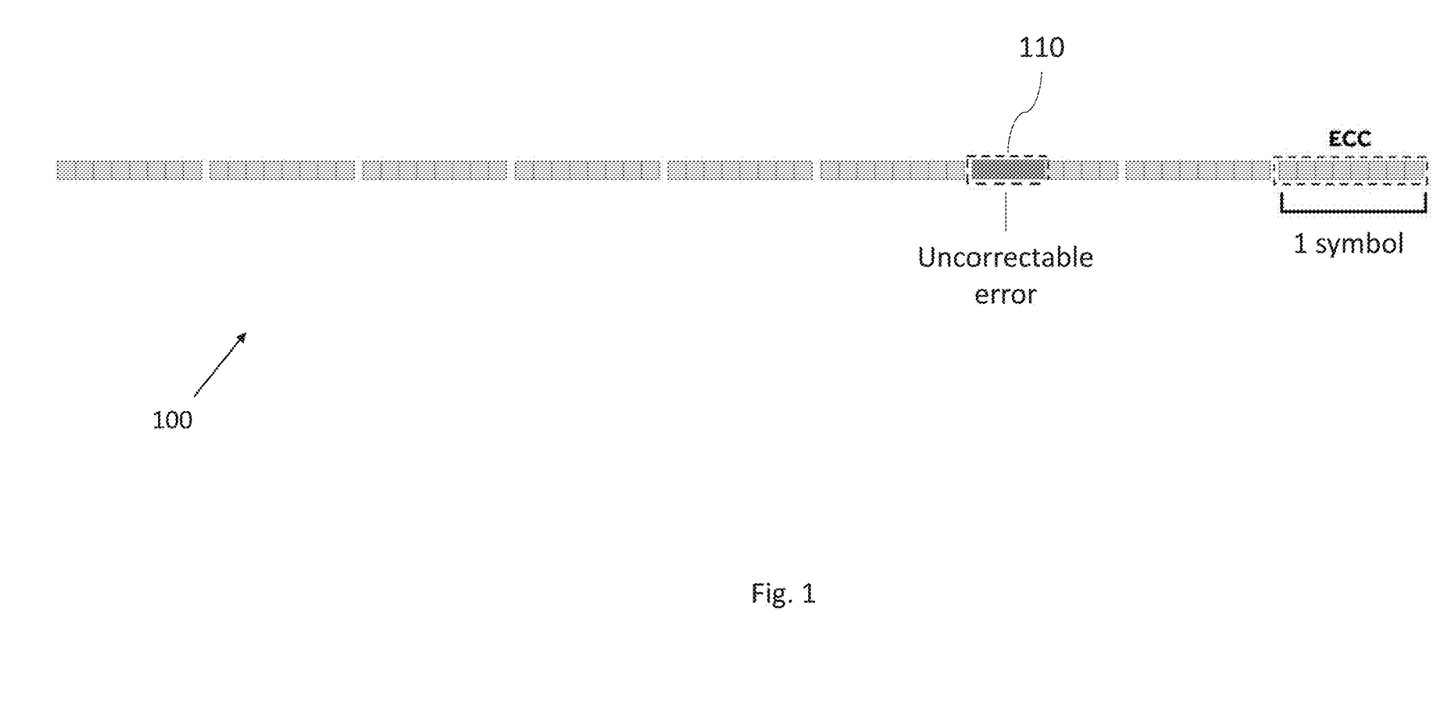
FIG. 1 illustrates an example codeword that is transmitted in a single beat.

When writing data to a memory module, it is desirable to write the data with ECC in such a way that the ECC can be used to provide sufficient error correction for the data when it is read out of the memory module. Reference is made to FIG. 1, which illustrates an example of a codeword 100 read out over the interface of a memory module. This codeword 100 is transmitted on a single clock edge of a clock signal for transmitting data over the interface. The codeword 100 is shown divided into 8 bit symbols, with 72 bits in total. As shown, the codeword 100 includes a single symbol of ECC. Additionally, as shown, an error has occurred for a certain subset of bits 110 of the codeword 100. When the memory controller receives these bits from the interface of the memory module, it does not know the location of the error. Therefore, two symbols of ECC are required to both detect and correct the bit error that occurs in a single symbol. Since only one symbol of ECC is present in the codeword, the memory controller is unable to correct the error.

SUMMARY

There is a need, therefore, to provide for improved error correction of data stored in a memory module. Simply increasing the size of the ECC may be undesirable as this will reduce the number of bits of message data that are transmitted over the interface in each data transfer, thereby reducing the rate at which the message data is written to and read from the memory module. One proposal is to distribute each codeword over multiple memory modules such that a first part of the codeword is read out of one interface and a second codeword is read out of another interface. Two symbols of ECC could then be included in the codeword, without reducing the ratio of message data to ECC in the codeword. With two symbols of ECC in the codeword, it would then be possible to correct a one symbol error occurring anywhere in the codeword. However, in some cases, it may be desirable to recover errors from a codeword output from a single memory module.

According to a first aspect, there is provided a memory controller configured to interface with a memory module via an interface of the memory module, wherein the memory controller comprises circuitry configured to: receive a set of message data to be stored in the memory module; calculate error correction code for the set of message data, wherein the error correction code comprises at least four symbols, wherein any two of the symbols of error correction code is operable to provide detection and correction of a single erroneous symbol at a previously unknown location in the set of message data; combine the set of message data with the error correction code to generate a codeword; and write the codeword to the memory module over the interface in at least four data transfers, each data transfer being associated with a different clock edge of a clock signal, wherein the writing the codeword over the interface comprises writing each symbol of the set of message data in sets of one or more bits, wherein each of the sets of bits of a symbol is located at a same one or more bit positions in different ones of the data transfers.

Therefore, according to embodiments, a codeword is spread temporally over at least four different data transfers that are transmitted over the same interface. The symbols in the codeword are arranged such that bits of each of the symbols are transferred at same positions in each data transfer. Since the symbols are localised to particular positions in different data transfers, any hardware faults that are associated with those positions only affect a limited number of symbols. The use of at least four data transfers, provides sufficient ECC to correct certain common errors that may affect the codeword.

In some embodiments, the writing the codeword over the interface comprises writing each of the symbols of the codeword to a different memory region of the memory module.

In some embodiments, any single one of the symbols of error correction code is operable to provide correction of a single erasure symbol of the set of message data at an identified location.

In some embodiments, the circuitry of the memory controller is configured to: subsequently, read the codeword from the memory module in at least four data transfers, each of the data transfers over which the codeword is read being associated with a different clock edge of the clock signal; and use the at least four symbols of error correction code to correct two or more erroneous symbols in the set of message data.

According to second aspect, there is memory controller configured to interface with a memory module via an interface of the memory module, wherein the memory controller comprises circuitry configured to: receive from the interface of the memory module, a codeword in at least four data transfers, each data transfer being associated with a different clock edge of a clock signal, wherein the codeword comprises a set of message data and error correction code comprising at least four symbols; and use two of the symbols of the error correction code to provide detection and correction of a single erroneous symbol at an unknown location in the set of message data, wherein the receiving the codeword over the interface comprises receiving each symbol of the set of message data in sets of one or more bits, wherein each of the sets of bits of a symbol is located at a same one or more bit positions in different ones of the data transfers.

In some embodiments, the circuitry is configured to use four of the symbols of the error correction code to correct two or more erroneous symbols in the set of message data.

In some embodiments, the circuitry is configured to: use each of one or more of the symbols of the error correction code to provide erasure correction of a single symbol at a known location in the set of message data.

In some embodiments, the using each of one or more symbols comprises using a single symbol of the error correction code to perform an erasure correction of one symbol of message data, wherein the one symbol of message data comprises at least one bit in each of the at least four data transfers.

In some embodiments, the performing the erasure correction comprises only correcting bits of the symbol at one same bit position in each of the data transfers.

In some embodiments, the receiving the codeword over the interface comprises receiving each of the symbols of the message data from a different memory region of the memory module.

In some embodiments, the using each of the one or more symbols comprises using two symbols of the error correction code to provide erasure correction of two symbols of the message data received from a single one of the regions of the memory module.

In some embodiments, the circuitry is configured to: prior to receiving the codeword, receive an earlier codeword in at least four earlier data transfers, each earlier data transfer being associated with a different clock edge of the clock signal, wherein the earlier codeword comprises an earlier set of message data and earlier error correction code comprising at least four symbols; and use at least two symbols of the earlier error correction code to provide detection and correction of at least one erroneous symbol at an unknown location in the earlier set of message data, wherein each of the single symbols of the message data for which erasure correction is performed is identified as erroneous in dependence upon a detected location of the at least one erroneous symbol in the earlier set of message data.

In some embodiments, the detecting the at least one erroneous symbol in the earlier set of message data comprises determining that erroneous bits of the least one erroneous symbol were received at a same bit position in different ones of the earlier data transfers; and in response to determining that the erroneous bits were received at the same bit position, storing in storage of the memory controller, an identification of a fault associated with the same bit position, wherein the one or more erasure corrected single symbols comprises a single symbol comprising bits transmitted at the same bit position, wherein the erasure correction of the single symbol comprising bits transmitted at the same bit position is performed in response to the stored identification of the fault associated with the same bit position.

In some embodiments, the detecting the at least one erroneous symbol comprises detecting erroneous bits received from one of the memory regions, wherein the circuitry is configured to, in response to the detecting erroneous bits received from one of the memory regions, store in a storage of the memory controller identification of a fault associated with the memory region from which the detected erroneous bits are received, wherein the using each of one or more symbols of the error correction code to provide erasure correction comprises providing erasure correction of at least two symbols of the message data in response to determining that those at least two symbols were received from the memory region associated with the fault.

In some embodiments, the determining that the at least two symbols were received from the memory region associated with the fault is performed in dependence upon: the location of the bits of those single symbols in the at least four data transfers; and a select signal issued by the memory controller to the memory module selecting a group of the memory regions from which the codeword is read.

In some embodiments, the circuitry of the memory controller is configured to, prior to receiving from the interface of the memory module, the codeword in at least four data transfers: calculate the error correction code bits for the set of message data; combine the set of message data with the error correction code to generate the codeword; and write the codeword to the memory module over the interface in at least four data transfers, each data transfer being associated with a different clock edge of the clock signal.

In some embodiments, for each of the at least four data transfers, each bit in the respective data transfer is transferred over a different wire of the interface, wherein the wires are grouped into sets, wherein each of the sets of the wires is for communication with a different one of the memory regions.

In some embodiments, the error correction code consists of four symbols, wherein the at least four transfers consists of four data transfers.

In some embodiments, the error correction code consists of eight symbols, wherein the at least four transfers consists of eight data transfers.

In some embodiments, the memory module is a dynamic random access memory module.

In some embodiments, the dynamic random access memory module is a dual in-line memory module.

In some embodiments, the error correction code is a Reed-Solomon code.

According to a third aspect, there is provided a system comprising: the memory controller according to either the first or the second aspect; and the memory module.

According to a fourth aspect, there is provided a method comprising: receiving a set of message data to be stored in a memory module; calculating error correction code for the set of message data, wherein the error correction code comprises at least four symbols, wherein any two of the symbols of error correction code is operable to provide detection and correction of a single erroneous symbol at a previously unknown location in the set of message data; combining the set of message data with the error correction code to generate a codeword; and writing the codeword to the memory module over an interface with the memory module in at least four data transfers, each data transfer being associated with a different clock edge of a clock signal, wherein the writing the codeword over the interface comprises writing each symbol of the set of message data in sets of one or more bits, wherein each of the sets of bits of a symbol is located at a same one or more bit positions in different ones of the data transfers.

According to a fifth aspect, there is provided a method comprising: receiving from an interface of a memory module, a codeword in at least four data transfers, each data transfer being associated with a different clock edge of a clock signal, wherein the codeword comprises a set of message data and error correction code comprising at least four symbols; and use two of the symbols of the error correction code to provide detection and correction of a single erroneous symbol at an unknown location in the set of message data, wherein the receiving the codeword over the interface comprises receiving each symbol of the set of message data in sets of one or more bits, wherein each of the sets of bits of a symbol is located at a same one or more bit positions in different ones of the data transfers.

According to a sixth aspect, there is provided a non-transitory computer readable storage medium comprising computer readable instructions which, when executed by a processor of a memory controller, cause a method to be carried out, the method comprising: receiving a set of message data to be stored in a memory module; calculating error correction code for the set of message data, wherein the error correction code comprises at least four symbols, wherein any two of the symbols of error correction code is operable to provide detection and correction of a single erroneous symbol at a previously unknown location in the set of message data; combining the set of message data with the error correction code to generate a codeword; and writing the codeword to the memory module over an interface with the memory module in at least four data transfers, each data transfer being associated with a different clock edge of a clock signal, wherein the writing the codeword over the interface comprises writing each symbol of the set of message data in sets of one or more bits, wherein each of the sets of bits of a symbol is located at a same one or more bit positions in different ones of the data transfers.

According to seventh aspect, there is provided a non-transitory computer readable storage medium comprising computer readable instructions which, when executed by a processor of a memory controller, cause a method to be carried out, the method comprising: receiving from an interface of a memory module, a codeword in at least four data transfers, each data transfer being associated with a different clock edge of a clock signal, wherein the codeword comprises a set of message data and error correction code comprising at least four symbols; and use two of the symbols of the error correction code to provide detection and correction of a single erroneous symbol at an unknown location in the set of message data, wherein the receiving the codeword over the interface comprises receiving each symbol of the set of message data in sets of one or more bits, wherein each of the sets of bits of a symbol is located at a same one or more bit positions in different ones of the data transfers.

BRIEF DESCRIPTION OF THE DRAWINGS

For a better understanding of the embodiments to show how the same may be carried into effect, reference will now be made by way of example to the accompanying drawings.

DETAILED DESCRIPTION

Embodiments of the application will now be described in more detail with reference to the accompanying Figures.

Figure 2:
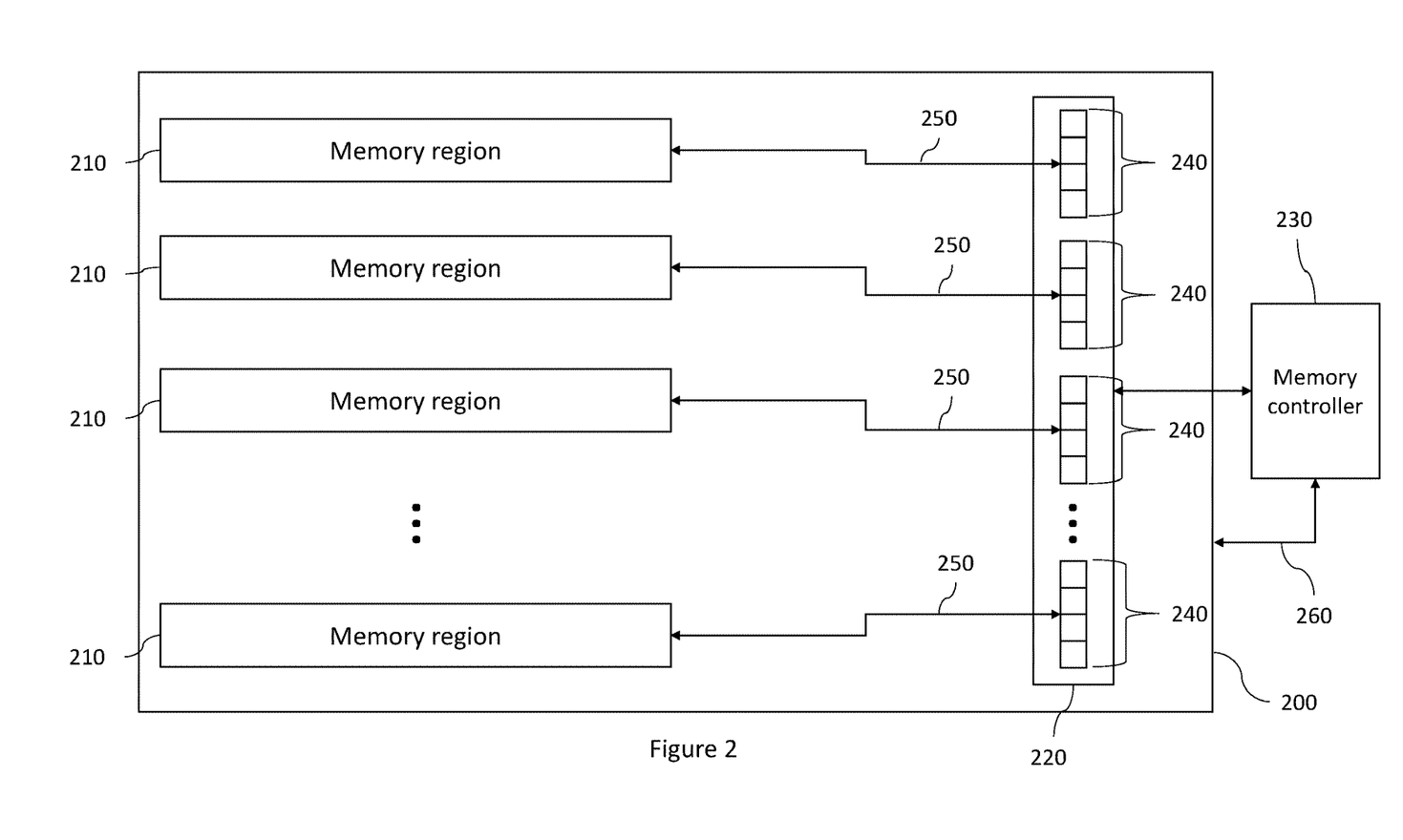
FIG. 2 illustrates an example of a system comprising a memory module and a memory controller.

Reference is made to FIG. 2, which illustrates an example of a memory module 200. The memory module 200 may be a memory module containing dynamic random access memory (DRAM). In this case, the memory module 200 comprises at least one dual in-line memory module (DIMM).

The memory module 200 comprises a plurality of memory regions 210. Each of these memory regions 210 is an integrated circuit comprising an array DRAM memory cells. Each of the regions 210 has a width of a certain number of bits. The width of each memory region 210 in examples is 4 bits. When a memory region 210 is being written to over a series of clock cycles, at each edge of the clock, a number of bits corresponding to the width of the memory region 210 is written to the memory region 210 by the memory controller 230 via interface 220. Similarly, when a memory region 210 is being read from over a series of clock cycles, at each edge of the clock, a number of bits corresponding to the width of the memory region 210 is read out from the memory region 210 and provided via interface 220 to the memory controller 230.

The interface 220 also has a certain width, which defines the number of bits that it is able to transport on a clock edge. The interface 220 operates in accordance with double data rate (DDR), in which a set of data is transferred over the interface 220 on the rising edge of the clock signal and another set of data is transferred over the interface 220 on the falling edge of the clock signal. The interface 220 is clocked by a clock (not shown) of the memory module 200. The width of the interface 220 may be 72 bits. Each bit position in the interface 220 corresponds to a different wire. In other words, all bits transmitted over the interface 220 at the same position in the interface 220 are transported over the same wire. The wires are grouped together to transfer data to different memory regions 210.

In FIG. 2, a set of bits transported over the interface 220 is shown divided into a number of subsets 240. Each of these subsets 240 is transferred to/from an associated set of memory regions 210 over a group of wires 250. Although in FIG. 2, every memory region 210 in the memory module 200 is shown as sending or receiving a subset 240 of data over the interface 220, in embodiments, only some of the memory regions 210 in the memory module 200 would be sending or receiving a subset of data over the interface 220 at a particular time. In other words, the memory module 200 comprises more memory regions 210 than subsets 240 that can fit in the interface 220. The memory module 200 comprises multiple sets of memory regions 210, referred to as ranks. A select signal 260 from the memory controller 230 determines which rank of memory regions 210 is read from or written to. Each group of wires 250 transfers data to/from one of the memory regions 210 in each rank. If each memory region 210 is four bits wide, each group of wires 250 consists of 4 wires.

The memory controller 230 interfaces with the memory module 200. The memory controller 230 comprises appropriate processing circuitry to enable it to perform its functions. The memory controller 230 may comprise at least one processor configured to execute computer readable instructions stored in a memory of the memory controller 230. The at least one processor of the memory controller 230 may execute the instructions to perform the operations described herein as being performed by the memory controller 230, such as calculating ECC, causing a codeword to be written to the memory module 200, causing a codeword to be read from the memory module 200, checking the message data against the ECC, etc. Additionally or alternatively, the memory controller 230 comprises a field programmable gate array (FPGA) or application specific integrated circuit (ASIC) configured to perform its functions. The FPGA and/or ASIC may perform the operations described herein as being performed by the memory controller 230, such as calculating ECC, causing a codeword to be written to the memory module 200, causing a codeword to be read from the memory module 200, checking the message data against the ECC, etc.

The memory controller 230 may issue refresh commands to refresh DRAM of the memory module 200. The memory controller 230 receives read and write requests to particular addresses in the memory module 200 from another entity (not shown). The memory controller 230 buffers and executes these read or write requests. The read or write requests may be received from one or more processors packaged in the same integrated circuit as the memory controller 230. The memory controller 230 also implements the error correction algorithm. When writing data to the memory module 200, this involves calculating, using a set of a message data, a set of ECC bits. Together the message data and ECC bits form a codeword. The memory controller 230 then writes the codeword to the memory module 200 over the interface 220 to memory regions 210 of the memory module 200.

When reading data from the memory module 200, the memory controller 230 issues requests to read certain addresses to the memory module 200. The data at these addresses is returned to the memory controller 230 over the interface 220. For each codeword of data received, the memory controller 230 performs a check of the message data bits using the ECC bits in the received codeword. If an error is detected in the codeword, the memory controller 230 may attempt to correct the codeword so as to reproduce the correct message data bits.

The bits in each codeword belong to symbols, with each symbol having the same number of bits, e.g. 8 bits. The memory controller 230 implements an error correcting algorithm in which two symbols of ECC are required to detect and correct an error in a symbol in the codeword when the location of the erroneous symbol is unknown beforehand, but only one symbol of ECC is required to correct an erasure in an identified symbol in the codeword. The ECCs may be Reed-Solomon codes.

According to embodiments, each codeword that is written to the memory module 200 is spread temporally over multiple data transfers. In other words, each codeword is written over the interface 220 in a number of data transfers that each take place on a different clock edge of the clock signal. Each of these data transfers is referred to herein as a beat. The set of bits of the codeword in each beat is divided into a plurality of subsets 240 as shown in FIG. 2, with each subset 240 being written to a different one of the memory regions 210.

Figure 3:
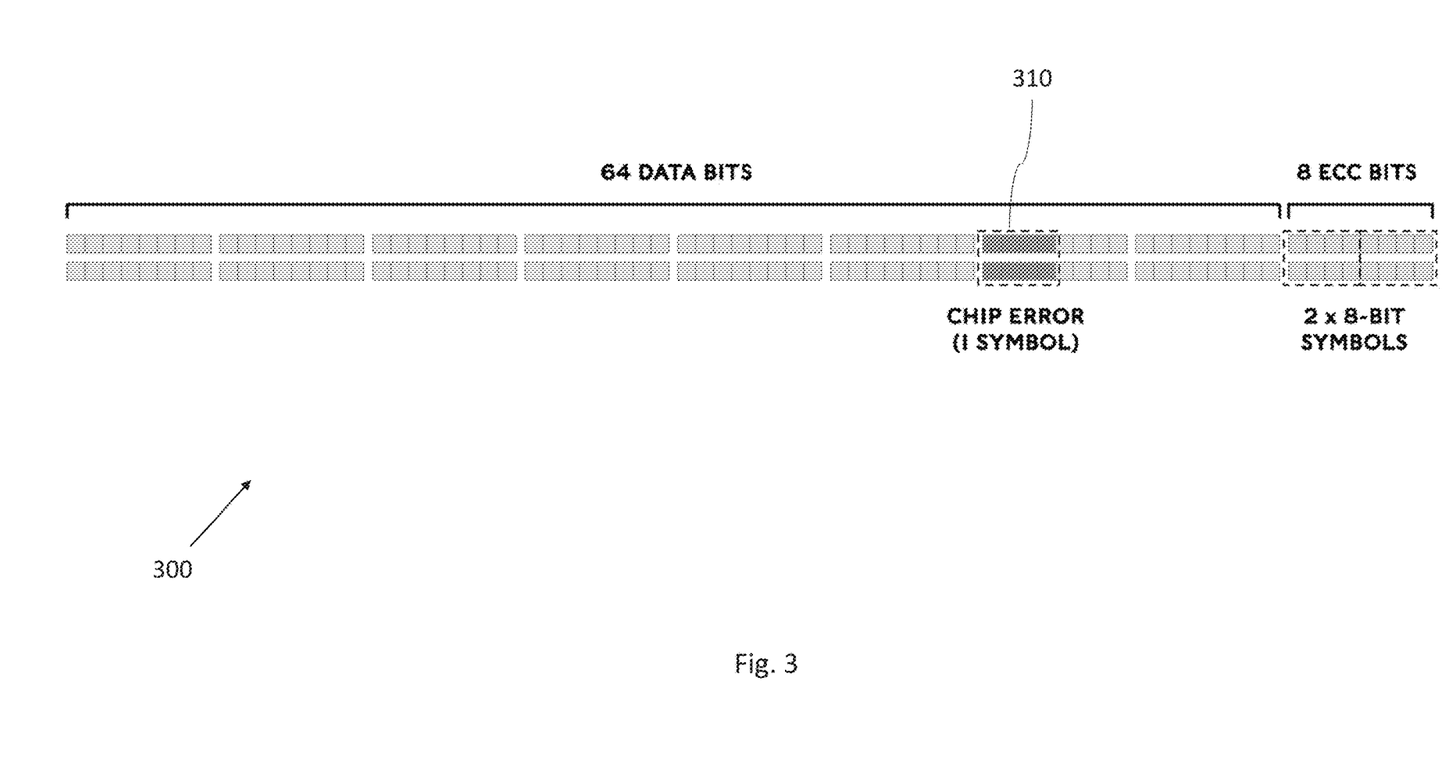
FIG. 3 illustrates an example codeword that is transmitted in two beats.

One proposal is to spread the codeword over two different beats. Reference is made to FIG. 3, which illustrates a codeword 300 that is transmitted over two different beats. Each row in the Figure represents a different beat. In this example, each beat consists of 72 bits (64 message data bits and 8 ECC bits), with the codeword 300 consisting of 144 bits (128 message data bits and 16 ECC bits). The Figure shows the bits of each beat being grouped into bytes. The ECC of the codeword 300 comprises 2 symbols. The memory controller 230 is configured to write the data in the codeword 300 to the memory regions 210 in such a way that the bits of each symbol in the codeword are delivered to the same memory region 210. In this way, symbols are not spread across different memory regions. The effect of writing the bits of the same symbol to the same memory region 210 is that, should a fault occur relating to one of the memory regions 210, only one symbol is affected. Therefore, when the codeword is read out of the memory module 200, only one symbol needs to be corrected using the ECC.

Unlike the codeword 100 in FIG. 1, the codeword 300 in FIG. 3 has the advantage that, since two symbols of ECC are available in the codeword 300, an error occurring in an unidentified symbol of the codeword 300 can be detected and corrected. For example, should a fault associated with one of the memory regions 210 occur, one or more errors may occur in the symbol 310. The memory controller 230 is, however, unaware of the fault and so does not at first identify symbol 310 as being erroneous. Therefore, when the memory controller 230 receives the codeword 300, it uses two symbols of the ECC to identify and correct the erroneous symbol 310. As part of the identifying and correcting process, the memory controller 230 determines that the erroneous bits occur in both of the beats of the codeword. Therefore, the memory controller 230 identifies the memory region 210 from which the symbol 310 was received as being associated with a fault.

Subsequently, when a further codeword is received, the memory controller 230 uses the identified symbol location to perform a correction of the bits of the symbol in the further codeword at that location. This correction is referred to as correcting an erasure, and only requires a single symbol of ECC, leaving one symbol of ECC remaining. However, with only a single symbol of ECC remaining, the transmission is vulnerable to any further random errors that may occur. Any random error that occurs in a codeword will require two ECC symbols to correct (since the location is unknown beforehand). However, only a single symbol of ECC remains. Therefore, any further random errors may not be correctable.

Therefore, in some embodiments, a codeword is spread over at least four different beats. After correcting for erasures caused by a fault associated with a memory region 210, two symbols of ECC remain, enabling a random error to be corrected.

Figure 4:
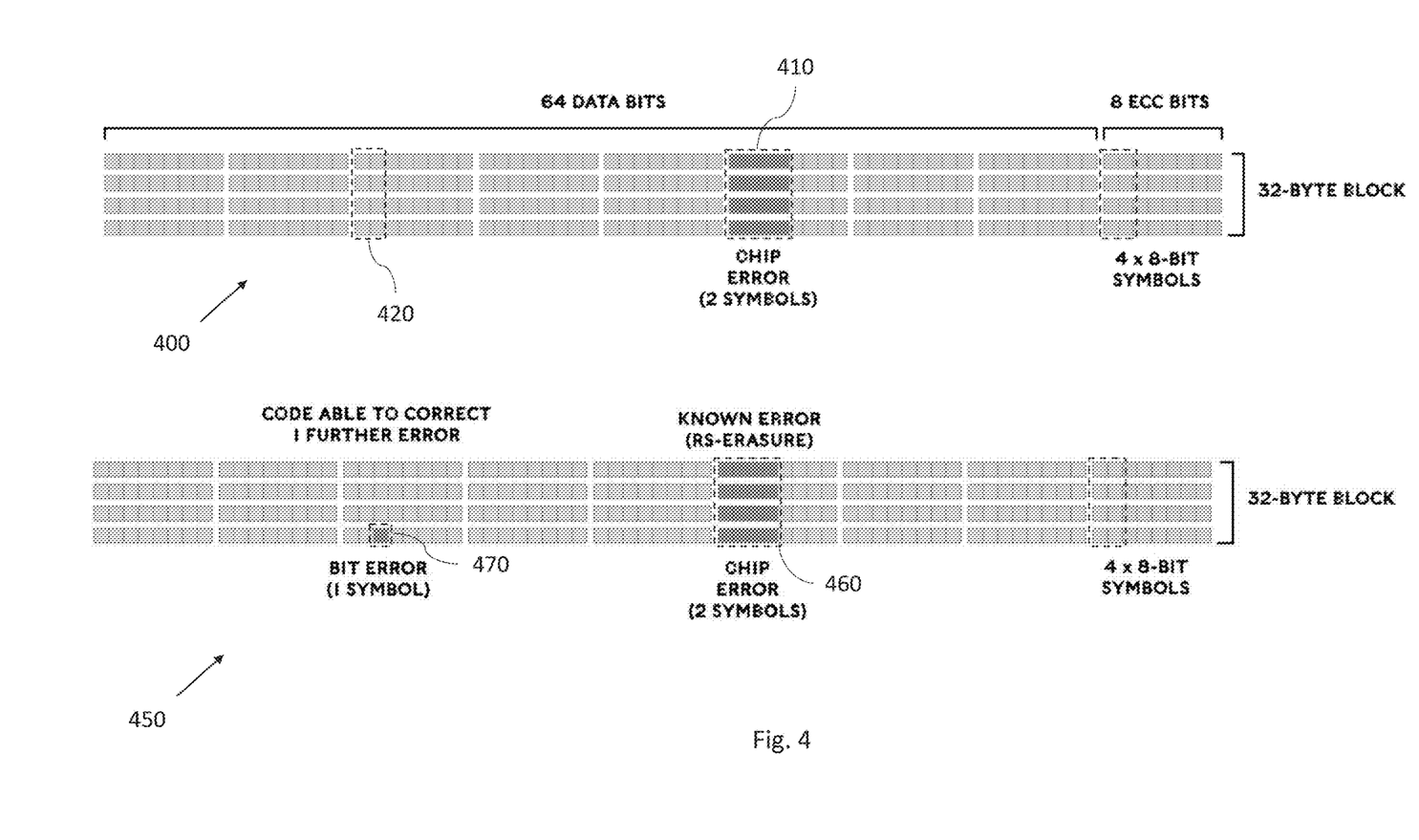
FIG. 4 illustrates examples of codewords that are transmitted in four beats.

Reference is made to FIG. 4, which illustrates codewords 400, 450 that may be read from the memory module 200 by the memory controller 230 in accordance with embodiments of the invention. The symbols in each of the codewords 400, 450 are grouped together in the respective codeword such that at least some of the bits of each symbol are transmitted at the same bit positions of the interface 220 in each beat. A hardware error that affects particular bit positions, will therefore affect a reduced number of symbols, enabling error correction to be carried out with fewer symbols of the ECC.

In the example of FIG. 4, the symbols are arranged so that two bits of each symbol are transmitted in each beat. An example symbol 420 is identified in codeword 400. It is understood that, since each of the memory regions 210 from which the codeword 400 is read provides 4 bits, each of the memory regions 210 provides two symbols of the codeword 400.

A first codeword 400 comprises errors in symbols 410 that are read from a memory region 210 with an associated fault. Since these erroneous symbols 410 are not at first identified to the memory controller 230, the memory controller 230 uses all four symbols of ECC to identify and correct the two erroneous symbols 410. The memory controller 230, in response to determining that errors occurred in bits of at least two different beats received from the same memory region 210, identifies memory region 210 as being associated with a fault. This identification process is described in more detail later.

Subsequently, a second codeword 450 is received at the memory controller 230 from the memory module 200. The memory controller 230 uses the stored identification of the memory region 210 associated with the fault to perform an erasure correction of symbols received from the identified memory region 210. This correction requires two symbols of the ECC, leaving two symbols remaining. As shown, a further error occurs at bit 470 in a further symbol belonging to the codeword 450. This further error may be a random error. The memory controller 230 is configured to use the remaining two symbols that were not used to correct the symbols 460 to correct the bit 470.

It is, therefore, understood that the scheme in FIG. 4 provides secure protection against errors since, even if a fault associated with one of the memory regions 210 occurs, additional symbols of ECC are available for correction of a further (e.g. random) error.

Since each symbol is spread out over four beats, each pair of bits of a symbol transmitted in a particular beat are located at the same two bit position in the interface 220. Transmitting each symbol using fewer different bit positions in the interface 220 allows for low cost correction of types of errors that occur in bits at the same bit position in different beats. As discussed, each bit position in the interface 220 is connected to a different wire that is used for reading and writing data to memory regions 210. An error associated with this wire, e.g. a pin error, will therefore cause errors at the same bit position in each beat. Since each symbol comprises bits at the same positions in each beat, only a single symbol is affected by this type of error.

Figure 5:
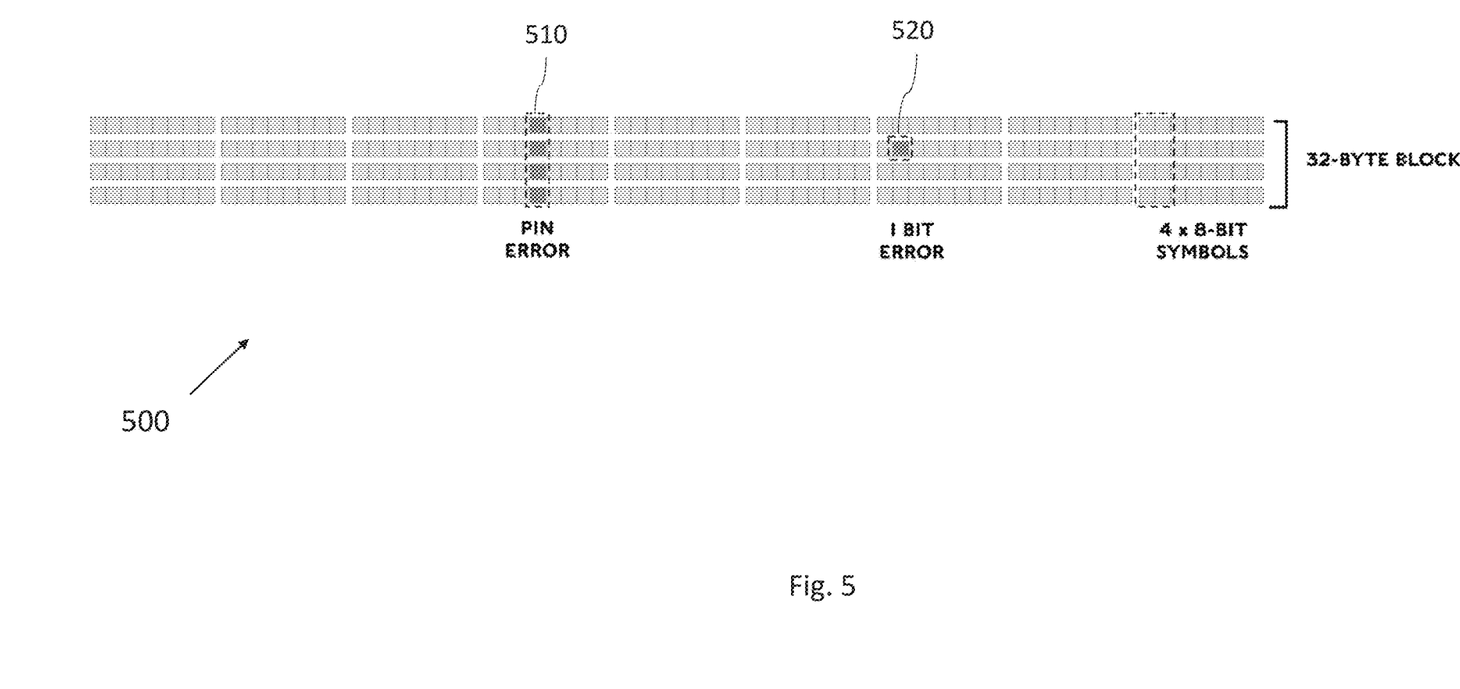
FIG. 5 illustrates an example of a further codeword that is transmitted in four beats.

Reference is made FIG. 5, which illustrates a codeword 500 in which errors occur in two symbols. In the codeword 500 errors occur in bits 510 and in bit 520. The bit 520 is only a single bit and, therefore, results in only a single erroneous symbol. The bits 510 include four erroneous bits that each belong to a single symbol. The errors in bits 510 may result from an error with a wire associated this bit position of the interface 220.

The codeword 500 includes two erroneous symbols in total. The memory controller 230 receives the codeword 500 and, using at most four ECC symbols, corrects both sets 510, 520 of erroneous bits. Therefore, by spreading each symbol over four beats, it is possible to reduce the number of affected symbols, allowing for more error correction.

Since the error associated with a wire results in errors (e.g. errors with bits 510) occurring at the same bit position, the memory controller 230 may determine that the bit position is associated with a fault. The memory controller 230 may then when subsequent codewords are received, use the error correction code to perform an erasure correction code of the bits at that bit position. Therefore, the memory controller 230 is able to reduce the number of ECC symbols required to correct errors associated with single positions, e.g. resulting from faulty wires, in addition to errors associated with memory regions 210.

To implement the scheme with four beats, before performing the reading steps to read a codeword (e.g. one of codewords 400, 450, 500) from the memory module 200 as discussed above, the memory controller 230 is configured to write the codeword to the memory module 200 in four separate beats. Prior to doing so, the memory controller 230 calculates four symbols of ECC for received message data so as to generate the codeword, the codeword comprising the received message data and the four symbols of ECC. The memory controller 230 then writes the codeword to the memory module 200 in four separate beats. The memory controller 230 writes the codeword such that at least some of the bits of each symbol are transmitted at the same bit positions of the interface 220 in each beat. The memory controller 230 spreads each symbol across four beats. The codewords may then be read out as discussed above, and the relevant error correction applied.

In embodiments, the techniques may be applied to spread codewords over more than four beats. Doing so allows for the correction of additional single symbol errors.

Figure 6:
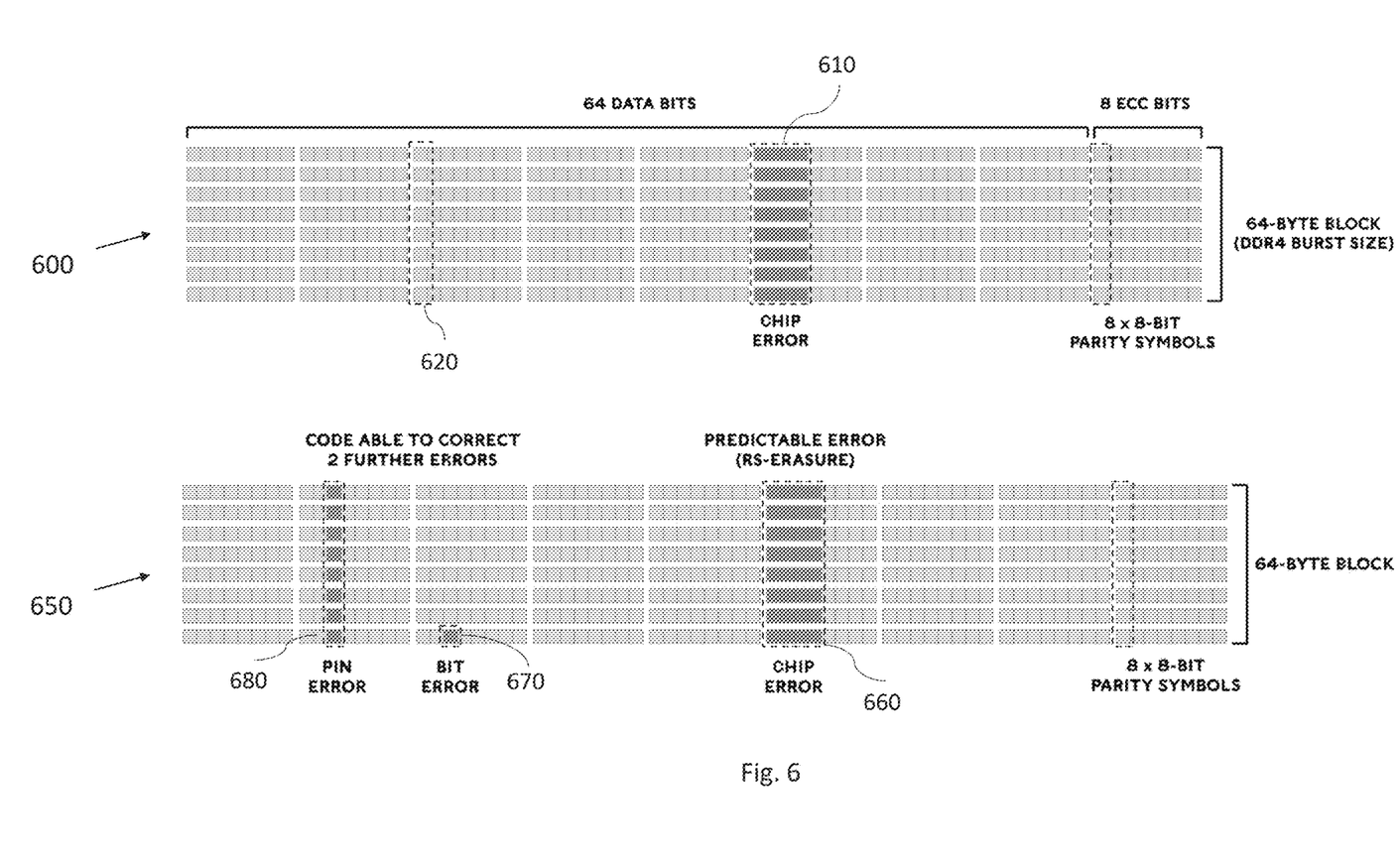
FIG. 6 illustrates examples of codewords that are transmitted in eight beats.

Reference is made to FIG. 6, which illustrates codewords 600, 650 that may be read from the memory module 200 by the memory controller 230 in accordance with embodiments of the application. Each symbol of these codewords 600, 650 is spread over eight different beats, with each symbol comprising one bit in each of the beats. An example symbol 620 in codeword 600 is indicated. Each of the memory regions 210 from which a codeword is read, provides four symbols of the codeword.

The first codeword 600 comprises errors in symbols 610 that are read from a memory region 210 with an associated fault. Since these erroneous symbols 610 are not at first identified to the memory controller 230, the memory controller 230 uses all eight symbols of ECC to identify and correct the four erroneous symbols 610. The memory controller 230 then, in response to determining that errors occurred in bits of at least two different beats received from the same memory region 210, identifies that memory region 210 as being associated with a fault.

Subsequently, a second codeword 650 is received at the memory controller 230 from the memory module 200. The memory controller 230 uses the stored identification of the memory region 210 associated with the fault to perform an erasure correction of symbols 660 received from the identified memory region 210. This correction requires four symbols of the ECC, leaving four symbols remaining. As shown, a further error occurs at bit 670 in a further symbol also belonging to the codeword 650. This further error may be a random error. The memory controller 230 is configured to use two symbols of ECC that are not used to correct the symbols 660 to correct the bit 670. As shown, further errors occur in bits 680 in a further symbol also belonging to the codeword 680. These errors may be due to a fault with a wire used to transmit bits in that position over the interface 220 to the associated memory region 210. The memory controller 230 is configured to use a further two symbols that are not used to correct the symbols 660 or used to correct the bit 670 to correct the bits 680.

It is, therefore, understood that by distributing a codeword over eight beats, it is possible to correct at least two further errors in addition to an erasure correction resulting from a fault associated with a memory region 210.

Figure 7:
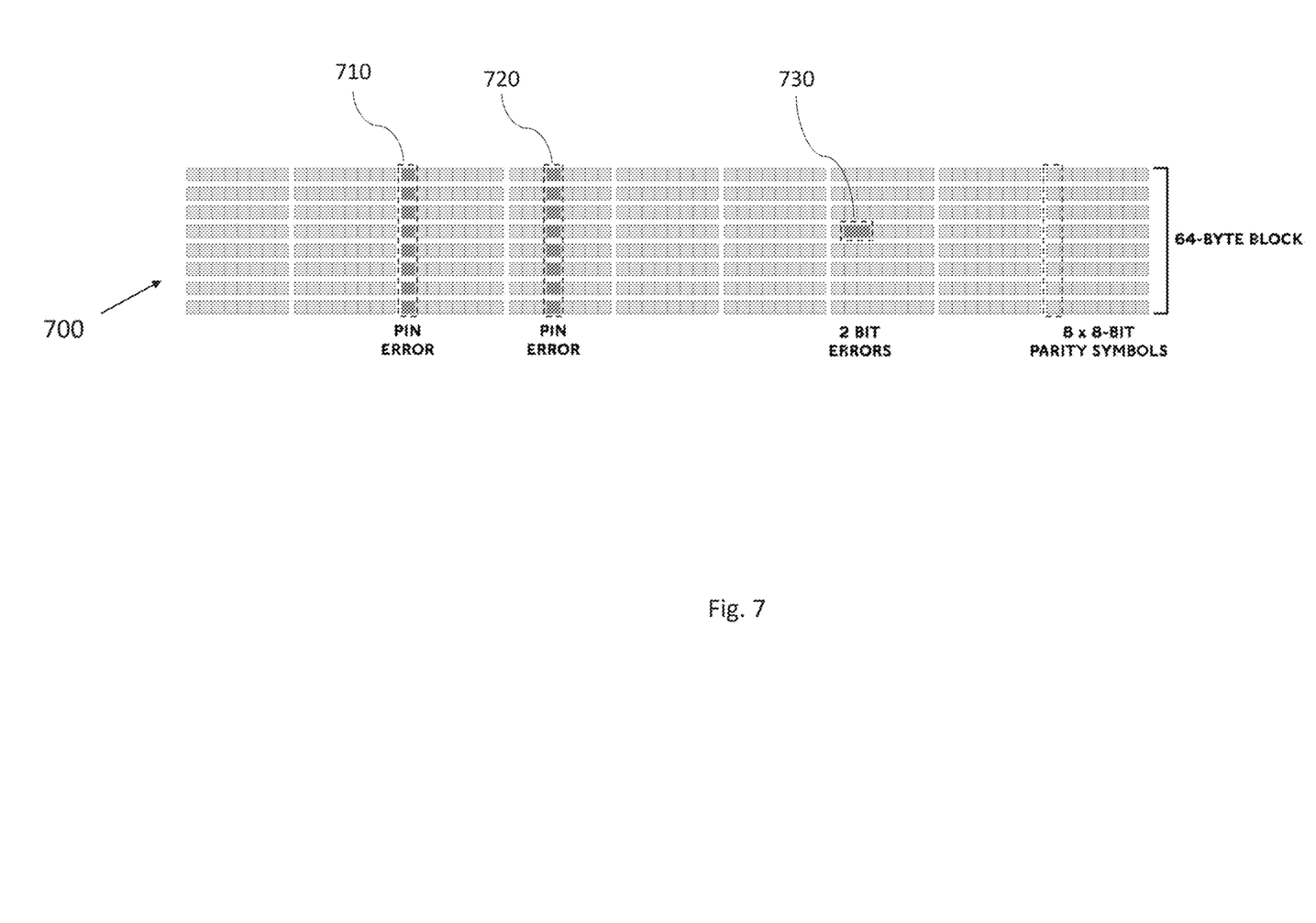
FIG. 7 illustrates examples of a further codewords that are transmitted in eight beats.

Reference is made to FIG. 7, which illustrates another codeword 700 spread over 8 beats that is used to correct multiple errors. As is illustrated in FIG. 7, the transmission of a codeword over 8 beats may be used to provide correction of more than two errors at unidentified locations.

As shown in FIG. 7, in the codeword 700 there are three sets of erroneous bits 710, 720, 730, which each occur in separate symbols. When the memory controller 230 receives the codeword 700, it uses two symbols of ECC to correct the bits 710, two symbols to correct the bits 720, and two symbols to correct the bits 730. Therefore, for this codeword 700 three different types of errors are corrected without use of an erasure correction. Moreover, two symbols of ECC remain unused such that, were a further error limited to one symbol to occur, the memory controller 230 would also be able to correct that further error.

To implement the scheme with eight beats, before performing the reading steps to read a codeword (e.g. one of codewords 600, 650, 700) from the memory module 200 as discussed above, the memory controller 230 is configured to write the codeword to the memory module 200 in eight separate beats. Prior to doing so, the memory controller 230 calculates eight symbols of ECC for received message data so as to generate the codeword, the codeword comprising the received message data and the eight symbols of ECC. The memory controller 230 then writes the codeword to the memory module 200 in eight separate beats. The memory controller 230 writes the codeword, such that for each symbol, the bits of that symbol are transmitted at the same bit position of the interface 220 in each beat. The memory controller 230 spreads each symbol across eight beats. The codewords may then be read out as discussed above, and the relevant error correction applied.

In FIGS. 4 to 7, at least some of the illustrated errors may result from hardware faults. For example, the erroneous sets of bits 510, 680, 710, 720, each contain bits arranged at the same position in the interface 220. Such errors may result from a faulty wire. As discussed above, if the memory controller 230 detects that errors occur at the same position across multiple beats, the memory controller 230 may in response, store an indication of a fault associated with that position. The memory controller 230 then performs an erasure correction of symbols received at that position in sequent codewords. The memory controller 230 performs this erasure correction of symbols received at the same position in the interface 220, even if those symbols are received from different memory regions 210.

Another example of an error pattern resulting from a hardware fault in FIGS. 4 to 7 is exemplified by bits 410, 460, 610, 660. Each of these bits 410, 460, 610, 660 contain errors in multiple symbols that are received from the same memory region 210. Such errors may result from a faulty memory region 210. As discussed above, in response to detecting errors in bits received from a certain memory region 210, the memory controller 230 stores an indication that that memory region 210 is associated with a fault. As discussed, a select signal 260 is issued by the memory controller 230 to control the selections of memory regions 210 from which codewords are read/written to. Each memory region 210 may be identified by the select signal 260 that applies to select a rank of memory regions 210 and, additionally, by the subset 240 of bit positions in the interface 220 that are allocated for that memory region 210. Therefore, the identification of the memory region 210 associated with a fault that is stored by the memory controller 230 may comprise the applied select signal 260 used when reading the relevant codeword, and the bit positions in the interface at which the errors are detected.

Once an identification of a faulty memory region 210 is stored, the memory controller 230 will perform an erasure correction for future symbols received from that memory region 210. The memory controller 230 performs the erasure correction of a symbol in dependence upon that symbol being received at a bit position associated with memory region 210 and in dependence upon the select signal 260 associated with the rank comprising that memory region 210 being active. If symbol are received at the same position in the interface 220, but the select signal 260 is different such that those symbols are not received from the faulty memory region 210 but from a memory region 210 in a different rank, the memory controller 230 does not perform the erasure correction of those symbols in response to the identification of the faulty memory region 210.

Figure 8:
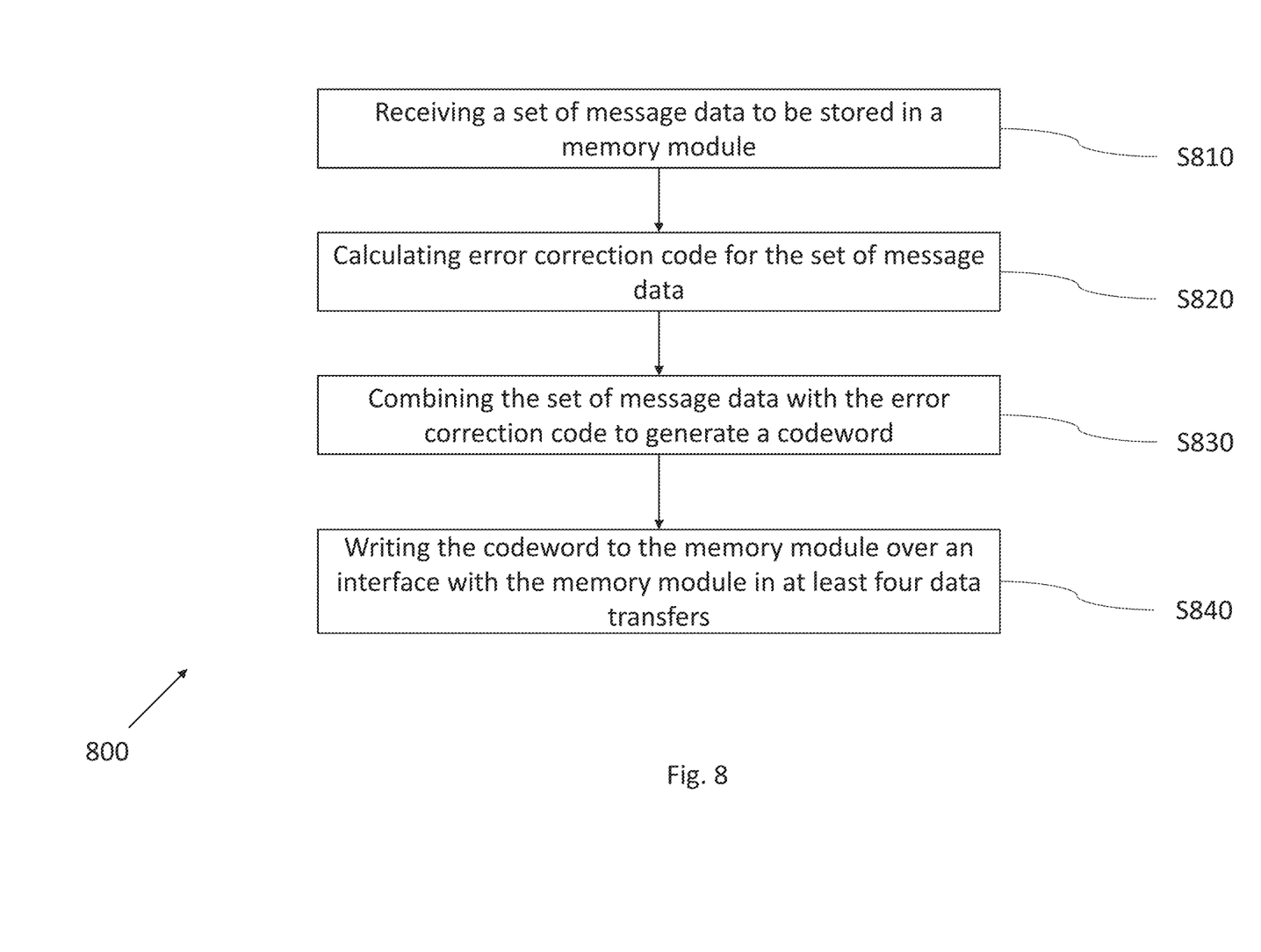
FIG. 8 illustrates an example method for writing data into a memory module.

Reference is made to FIG. 8, which illustrates a method 800 for writing data to a memory module. The method may be performed by the memory controller 230 to write data to the memory module 200.

At S810, the memory controller receives a set of message data to be stored in the memory module.

At S820, the memory controller calculates error correction code for the set of message data.

At S830, the memory controller combines the set of message data with the error correction code to generate a codeword.

At S840, the memory controller writes the codeword to the memory module over an interface with the memory module in at least four data transfers.

Figure 9:
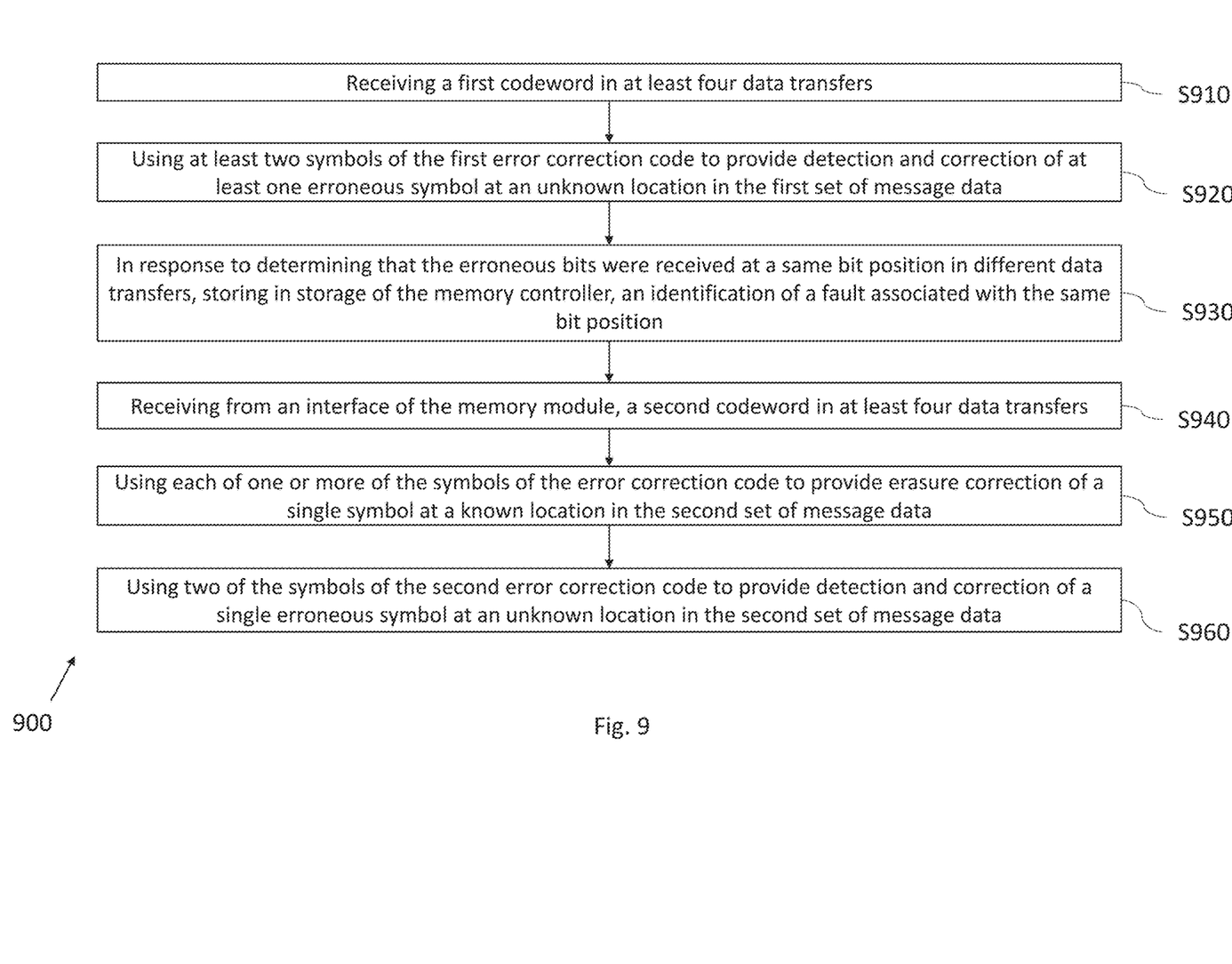
FIG. 9 illustrates an example method for reading data from a memory module.

Reference is made to FIG. 9, which illustrates a method 900 for reading data from a memory module. The method 900 may be performed by the memory controller 230 to read data from the memory module 200. It would be appreciated that not all of the steps of the method 900 are essential but that, in some embodiments, one or more of the steps may be omitted.

At S910, the memory controller receives from the memory module, a first codeword in at least four data transfers. The first codeword comprising first error correction code and a first set of message data.

At S920, the memory controller uses two symbols of the first error correction code to perform detection and correction of at least one erroneous symbol at an unknown location in the first set of message data.

At S930, in response to determining that the erroneous bits were received at a same bit position in different data transfers, the memory controller stores an identification of a fault associated with the same bit position. The identification of a fault associated with a same bit position may comprise an identification of a fault associated with a memory region, such as a DRAM chip, which is associated with the same bit position in the interface. Alternatively, the identification of a fault associated with a same bit position may comprise an identification of a fault associated with a wire, which is associated with the same bit position in the interface.

At S940, the memory controller receives from the interface of the memory module, a second codeword in at least four data transfers. The second codeword comprises a second set of message data and second error correction code.

At S950, the memory controller uses each of one or more of the symbols of the second error correction code to provide erasure correction of a single symbol at a known location in the second set of message data. The known location may include the location of the same bit position determined at S930.

At S960, the memory controller is configured to use two of the symbols of the second error correction code to provide detection and correction of a single erroneous symbol at an unknown location in the second set of message data.

In some embodiments, the two methods 800 and 900 may be combined together. In this case, the memory controller may first write the first and second codewords to the memory module in accordance with the method 800, and then later read the first and second codewords from the memory module in accordance with the method 900.

The described memory module and memory controller may be implemented as components of an integrated circuit comprising an intelligence processing unit (IPU) as described in our earlier application U.S. patent application Ser. No. 15/886,065, which is incorporated by reference.

It will be appreciated that the above embodiments have been described by way of example only.

The invention claimed is:

1. A memory controller configured to interface with a memory module via an interface of the memory module, wherein the memory controller comprises circuitry configured to:
receive a set of message data to be stored in the memory module;
calculate error correction code for the set of message data, wherein the error correction code comprises at least four symbols, wherein two symbols of the error correction code are configured to provide detection and correction of a single erroneous symbol at a previously unknown location in the set of message data;
combine the set of message data with the error correction code to generate a codeword; and
write the codeword to the memory module over the interface in at least four data transfers, each data transfer being associated with a different clock edge of a clock signal,
wherein the writing the codeword over the interface comprises writing each symbol of the set of message data in sets of one or more bits, wherein each of the sets of one or more bits belonging to a same symbol is located at a same one or more bit positions in different ones of the data transfers.

2. The memory controller of claim 1, wherein the writing the codeword over the interface comprises writing each of the symbols of the codeword to a different memory region of the memory module.

3. The memory controller of claim 1, wherein a single one symbol of the error correction code is configured to provide correction of a single erasure symbol of the set of message data at an identified location.

4. The memory controller of claim 1, wherein the circuitry of the memory controller is configured to:
subsequently, read the codeword from the memory module in at least four data transfers, each of the data transfers over which the codeword is read being associated with a different clock edge of the clock signal; and
use the error correction code to correct two or more erroneous symbols in the set of message data.

5. The memory controller of claim 1, wherein the error correction code is a Reed-Solomon code.

6. A memory controller configured to interface with a memory module via an interface of the memory module, wherein the memory controller comprises circuitry configured to:
receive from the interface of the memory module, a codeword in at least four data transfers, each data transfer being associated with a different clock edge of a clock signal, wherein the codeword comprises a set of message data and error correction code comprising at least four symbols; and
use two of the symbols of the error correction code to provide detection and correction of a single erroneous symbol at an unknown location in the set of message data,
wherein the receiving the codeword over the interface comprises receiving each symbol of the set of message data in sets of one or more bits, wherein each of the sets of one or more bits belonging to a same symbol is located at a same one or more bit positions in different ones of the data transfers.

7. The memory controller of claim 6, wherein the circuitry is configured to use four of the symbols of the error correction code to correct two or more erroneous symbols in the set of message data.

8. The memory controller of claim 6, wherein the circuitry is configured to:
use a further symbol of the error correction code to provide erasure correction of a second symbol of the set of message data at a known location in the set of message data.

9. The memory controller of claim 8, wherein the second symbol of the set of message data comprises at least one bit in each of the at least four data transfers.

10. The memory controller of claim 9, wherein the erasure correction comprises only correcting bits of the second symbol of the set of message data at one same bit position in each of the data transfers.

11. The memory controller of claim 6, wherein the receiving the codeword over the interface comprises receiving each of the symbols of the message data from a different memory region of the memory module.

12. The memory controller of claim 11, wherein for each of the at least four data transfers, each bit in a respective data transfer is transferred over a different wire of the interface, wherein the wires are grouped into sets, wherein each of the sets of the wires is for communication with a different one of the memory regions.

13. The memory controller of claim 11, wherein the circuitry is configured to use each of one or more of the symbols of the error correction code to provide erasure correction of a single symbol at a known location in the set of message data,
wherein the using each of the one or more symbols comprises using two symbols of the error correction code to provide erasure correction of two symbols of the message data received from a single one of the memory regions of the memory module.

14. The memory controller of claim 6, wherein the circuitry is configured to:
use a further symbol of the error correction code to provide erasure correction of a second symbol at a known location in the set of message data;
prior to receiving the codeword, receive an earlier codeword in at least four earlier data transfers, each earlier data transfer being associated with a different clock edge of the clock signal, wherein the earlier codeword comprises an earlier set of message data and earlier error correction code comprising at least four symbols; and
use at least two symbols of the earlier error correction code to provide detection and correction of at least one erroneous symbol at an unknown location in the earlier set of message data,
wherein the second symbol in the set of message data is identified as erroneous in dependence upon a detected location of the at least one erroneous symbol in the earlier set of message data.

15. The memory controller of claim 6, wherein the circuitry of the memory controller is configured to, prior to receiving from the interface of the memory module, the codeword in at least four data transfers:
calculate the error correction code bits for the set of message data;
combine the set of message data with the error correction code to generate the codeword; and
write the codeword to the memory module over the interface in at least four data transfers, each data transfer being associated with a different clock edge of the clock signal.

16. The memory controller of claim 6, wherein the error correction code is a Reed-Solomon code.

17. A method comprising:
receiving a set of message data to be stored in memory;
calculating error correction code for the set of message data, wherein the error correction code comprises a set of four error correction symbols, wherein two of the error correction symbols are configured to provide detection and correction of a single erroneous symbol at a previously unknown location in the set of message data;
generating a codeword from the set of message data and the error correction code; and
writing the codeword to the memory in at least four data transfers, each data transfer being associated with a different clock edge of a clock signal, including writing each symbol of the set of message data in bit sets, wherein each of the bit sets belonging to a same symbol is located at a same at least one bit position in different ones of the data transfers.

18. The method of claim 17, wherein writing the codeword includes writing a plurality of symbols of the codeword to a plurality of regions of the memory.

19. The method of claim 17, further comprising providing correction of a single erasure symbol of the set of message data at a previously-identified location using a single one of the error correction symbols.

20. The method of claim 17, further comprising:
subsequently, reading the codeword from the memory in at least four data transfers, each of the data transfers over which the codeword is read being associated with a different clock edge of the clock signal; and
using the error correction symbols to correct two or more erroneous symbols in the set of message data.

21. A method performed by a memory controller associated with a memory, the method comprising:
receiving a codeword in at least four data transfers, each data transfer being associated with a different clock edge of a clock signal, wherein the codeword comprises a plurality of message data symbols and four error correction symbols; and
detect and correct a single erroneous symbol at a previously unknown location in the plurality of message data symbols using two of the error correction symbols,
wherein receiving the codeword comprises receiving each symbol of the plurality of message data symbols in bit sets, wherein each of the bit sets belonging to a same symbol are located at a same one or more bit positions in different ones of the data transfers.

22. The method of claim 21, further comprising:
using another two of the error corrections symbols to provide erasure correction of two symbols at known locations in the set of message data.

23. A non-transitory computer readable storage medium comprising computer readable instructions which, when executed by a processor of a memory controller, cause a method to be carried out, the method comprising:
receiving a set of message data to be stored in memory;
calculating error correction code for the set of message data, wherein the error correction code comprises a set of four error correction symbols, wherein two of the error correction symbols are configured to provide detection and correction of a single erroneous symbol at a previously unknown location in the set of message data;
generating a codeword from the set of message data and the error correction code; and
writing the codeword to the memory in at least four data transfers, each data transfer being associated with a different clock edge of a clock signal, including writing each symbol of the set of message data in bit sets, wherein each of the bit sets of a same symbol is located at a same at least one bit position in different ones of the data transfers.

24. The non-transitory computer readable storage medium of claim 23, wherein writing the codeword includes writing a plurality of symbols of the codeword to a plurality of regions of the memory.

25. The non-transitory computer readable storage medium of claim 23, the method further comprising providing correction of a single erasure symbol of the set of message data at a previously-identified location using a single one of the error correction symbols.

26. The non-transitory computer readable storage medium of claim 23, the method further comprising:
subsequently, reading the codeword from the memory in at least four data transfers, each of the data transfers over which the codeword is read being associated with a different clock edge of the clock signal; and
using the error correction symbols to correct two or more erroneous symbols in the set of message data.

27. A non-transitory computer readable storage medium comprising computer readable instructions which, when executed by a processor of a memory controller, cause a method to be carried out, the method comprising:
receiving a codeword in at least four data transfers, each data transfer being associated with a different clock edge of a clock signal, wherein the codeword comprises a plurality of message data symbols and four error correction symbols; and
detect and correct a single erroneous symbol at a previously unknown location in the plurality of message data symbols using two of the error correction symbols,
wherein receiving the codeword comprises receiving each symbol of the plurality of message data symbols in bit sets, wherein each of the bit sets belonging to a same symbol are located at a same one or more bit positions in different ones of the data transfers.

28. The non-transitory computer readable storage medium of claim 27, the method further comprising:
using another two of the error corrections symbols to provide erasure correction of two symbols at known locations in the set of message data.

* * * * *